United States Patent [19]
Glenn

[11] Patent Number: 6,143,981
[45] Date of Patent: Nov. 7, 2000

[54] PLASTIC INTEGRATED CIRCUIT PACKAGE AND METHOD AND LEADFRAME FOR MAKING THE PACKAGE

[75] Inventor: Thomas P. Glenn, Gilbert, Ariz.

[73] Assignee: Amkor Technology, Inc., Chandler, Ariz.

[21] Appl. No.: 09/103,760

[22] Filed: Jun. 24, 1998

[51] Int. Cl.[7] .................................................. H01L 23/28
[52] U.S. Cl. .................... 174/52.4; 438/123; 438/124; 257/670; 257/676; 257/666; 361/707; 361/400; 361/401; 29/830
[58] Field of Search .................... 174/52.4; 438/123, 438/124; 257/670, 676, 666; 361/707, 400, 401; 29/830

[56] References Cited

U.S. PATENT DOCUMENTS

| | | | |
|---|---|---|---|
| 3,838,984 | 10/1974 | Crane et al. | 37/83 |
| 4,530,152 | 7/1985 | Roche et al. | 29/588 |
| 5,041,902 | 8/1991 | McShane | 357/79 |
| 5,157,480 | 10/1992 | McShane et al. | 357/74 |
| 5,172,213 | 12/1992 | Zimmerman | 257/796 |
| 5,172,214 | 12/1992 | Castro | 257/676 |
| 5,258,094 | 11/1993 | Furui et al. | 156/634 |
| 5,278,446 | 1/1994 | Nagaraj et al. | 257/707 |
| 5,435,057 | 7/1995 | Bindra et al. | 29/830 |
| 5,521,429 | 5/1996 | Aono et al. | 257/676 |
| 5,701,034 | 12/1997 | Marrs | 257/706 |
| 5,783,861 | 7/1998 | Son | 253/693 |
| 5,835,988 | 11/1998 | Ishii | 257/684 |
| 5,859,471 | 1/1999 | Kuraishi et al. | 257/666 |
| 5,866,939 | 2/1999 | Shin et al. | 257/666 |
| 5,877,043 | 3/1999 | Alcoe et al. | 438/123 |
| 5,894,108 | 4/1999 | Mostafazadeh et al. | 174/52.4 |

FOREIGN PATENT DOCUMENTS

| | | |
|---|---|---|
| 57-45959 | 3/1982 | Japan . |
| 62-9639 | 7/1985 | Japan . |
| 61-39555 | 2/1986 | Japan . |
| 63-205935 | 8/1988 | Japan . |
| 63-233555 | 9/1988 | Japan . |
| 64-54749 | 3/1989 | Japan . |
| 7-312405 | 11/1995 | Japan . |
| 8-125066 | 5/1996 | Japan . |
| 8-306853 | 11/1996 | Japan . |
| 9-8205 | 1/1997 | Japan . |
| 9-8206 | 1/1997 | Japan . |
| 9-8207 | 1/1997 | Japan . |
| 9-92775 | 4/1997 | Japan . |

*Primary Examiner*—William A. Cuchlinski, Jr.
*Assistant Examiner*—Ronnie Mancho
*Attorney, Agent, or Firm*—Skjerven, Morrill, MacPherson, Franklin & Friel LLP; James E. Parsons

[57] ABSTRACT

Packages for an integrated circuit die and methods and leadframes for making such packages are disclosed. The package includes a die, a die pad, peripheral metal contacts, bond wires, and an encapsulant. The die pad and contacts are located at a lower surface of the package. The die pad and the contacts have side surfaces which include reentrant portions and asperities to engage the encapsulant.

A method of making a package includes providing a metal leadframe having a die pad in a rectangular frame. Tabs extend from the frame toward the die pad. The die pad and tabs have side surfaces with reentrant portions and asperities. A die is attached to the die pad. The die is electrically connected to the tabs. An encapsulant is applied to the upper and side surfaces of the leadframe. Finally, the leadframe is cut in situ so that the die pad and tabs are severed from the frame, the sides of the package are formed, and the package is severed from the leadframe.

19 Claims, 5 Drawing Sheets

PLASTIC INTEGRATED CIRCUIT PACKAGE AND METHOD AND LEADFRAME FOR MAKING THE PACKAGE

FIELD OF THE INVENTION

The present invention is to directed toward an improved plastic package for an integrated circuit die, and a method of making such a package.

BACKGROUND OF THE INVENTION

Integrated circuit die are conventionally enclosed in plastic packages that provide protection from hostile environments and enable electrical interconnection between the integrated circuit die and printed circuit boards. The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package.

The leadframe is the central supporting structure of such a package. A portion of the leadframe is internal to the package, i.e., completely surrounded by the plastic encapsulant. Portions of the leads of the leadframe extend eternally from the package and are used to connect the package externally.

Further background information concerning conventional plastic integrated circuit packages and leadframes is contained in chapter 8 of the book Microelectronics Packaging Handbook (1989), which was edited by R. Tummala and E. Rymaszewski, and is published by Van Nostrand Reinhold, 115 Fifth Avenue, New York, N.Y.

A problem with conventional plastic packages is that their internal leadframes limit reduction of the size of the packages. Practitioners have attempted to reduce the size of packages by eliminating internal leadframes, as is shown in U.S. Pat. No. 4,530,152 to Roche et al and U.S. Pat. No. 5,172,214 to Castro, but these packages have numerous disadvantages. The contacts of the package shown by Roche in the '152 patent have orthogonal side surfaces. Accordingly, the packages are believed to be unreliable because the contacts could easily be pulled from the encapsulant material. The package shown by Castro in the '214 patent has leads which extend into the body of the package from a lower external surface of the package to the top of the die. These leads are large, and have complex bends. Including such leads in a package would increase manufacturing costs and limit reductions in the lateral size of the package. By contrast, the contacts of the packages within the present invention are simpler, do not have such bends, and allow for packages of smaller lateral size.

SUMMARY OF THE INVENTION

The present invention is to directed toward improved plastic packages for housing an integrated circuit die, and to leadframes and methods for making such packages. The packages of the present invention are easier and less expensive to make than conventional plastic packages, and are more reliable and efficiently-sized than conventional packages.

In one embodiment of an assembly method for a package within the present invention, Step 1 provides a metal leadframe. The leadframe includes a rectangular frame, e.g., a square frame. A substantially planar die pad is within and connected to the frame. A plurality of finger-like rectangular tabs extend from the frame toward the die pad without contacting the die pad. The number and location of the tabs around the frame may vary. The die pad and the tabs have peripheral side surfaces which include a reentrant portion(s) and asperities. The reentrant position(s) and asperities enhance the connection of the die pad and tabs to the plastic encapsulating material.

Step 2 places and attaches an integrated circuit to a first surface of the die pad.

Step 3 electrically connects a bond wire or an equivalent conductor between each bonding pad of the die and a first surface of one of the tabs.

Step 4 places the leadframe on a flat surface, with the die facing upwards, and applies a viscous encapsulant material onto the upward facing first surface of the leadframe. The encapsulant material is then hardened. The encapsulant material covers the die, the bond wires, a first surface of the tabs, the first surface of the die pad, the side surfaces of the die pad and tabs, and all or part of the frames around the die pad. A lower second surface of the leadframe, including a lower second surface of the die pad and tabs, is not covered with encapsulant.

Step 5 plates the exposed surfaces of the leadframe, including the exposed second surfaces of the die pad and tabs with a metal, such as copper, gold, lead-tin solder, tin, nickel, palladium, or any solderable metal.

Step 6 cuts the encapsulated portions of the leadframe with a saw. In particular, step 6 either obliterates the disposable portions of the leadframe, or severs the disposable portions of the leadframe from other components of the leadframe, such as the die pad and tabs, which are to be included in the package. Step 6 also trims the encapsulant material and thereby forms the peripheral sides of the package.

A feature of the packages built by the above described method is that the die pad and contacts (i.e., the severed tabs of the leadframe) of the package are located at the lower first surface of the package. The first surfaces and side surfaces of the die pad and tabs are internal to the package, i.e., covered with encapsulant material, but the second surfaces of the die pad and tabs are not covered by encapsulant material. The die pad and tabs are isolated from each other by encapsulant material.

In a completed package, only the encapsulant material holds the die pad and contacts to the package. The connection of the encapsulant material to the die pad and contacts is enhanced by the reentrant portion(s) and asperities of the side surfaces of the die pad and contacts. The reentrant portions and asperities of the side surfaces of the die pad and contacts function as encapsulant fasteners or lead locks.

Numerous variations of the leadframe, package, and assembly method described above also are described in this application. In one alternative assembly method, a leadframe is provided which allows a plurality of packages to be constructed simultaneously.

A leadframe for constructing a plurality of packages simultaneously includes, for example, a matrix of interconnected rectangular frames. A die pad is within and connected to each of the interconnected frames. A set of tabs extend from each frame toward the sides of the enclosed die pad without contacting the die pad. A subsequent encapsulation step includes applying an encapsulant material onto the surface of the leadframe to which the dies are attached. This step covers the dies and the side surfaces of the die pads and tabs within a single block of encapsulant material. The encapsulant material is then hardened. A cutting step separates individual packages from each other and from the disposable portions of the leadframe. The cutting step also severs the connection between each of the interconnected frames and the die pad and tabs within each frame.

BRIEF DESCRIPTION OF DRAWINGS

FIG. 3 shows an embodiment of a side surface of a die pad and tab.

DETAILED DESCRIPTION

Figure 1:
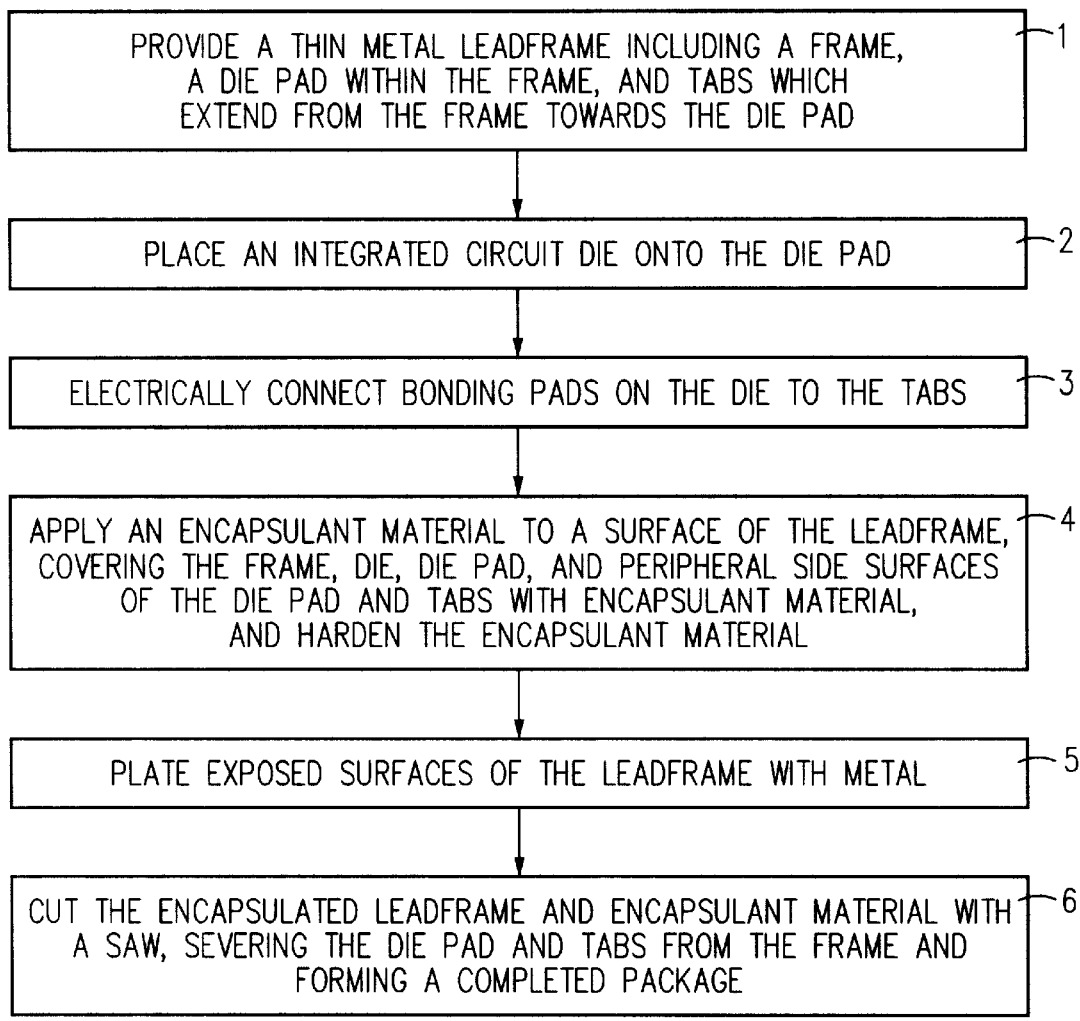
FIG. 1 is a flow chart of a method of making a package.
Figure 8:
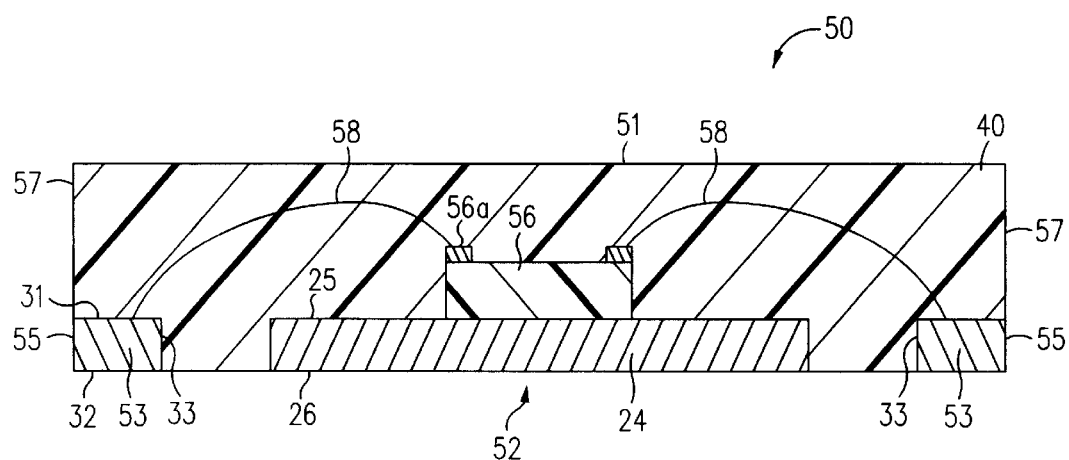
FIG. 8 is a cross-sectional side view of a completed package.

FIG. 1 shows an exemplary method of assembling a package in accordance with the present invention. FIG. 8 shows a completed package.

Figure 2:
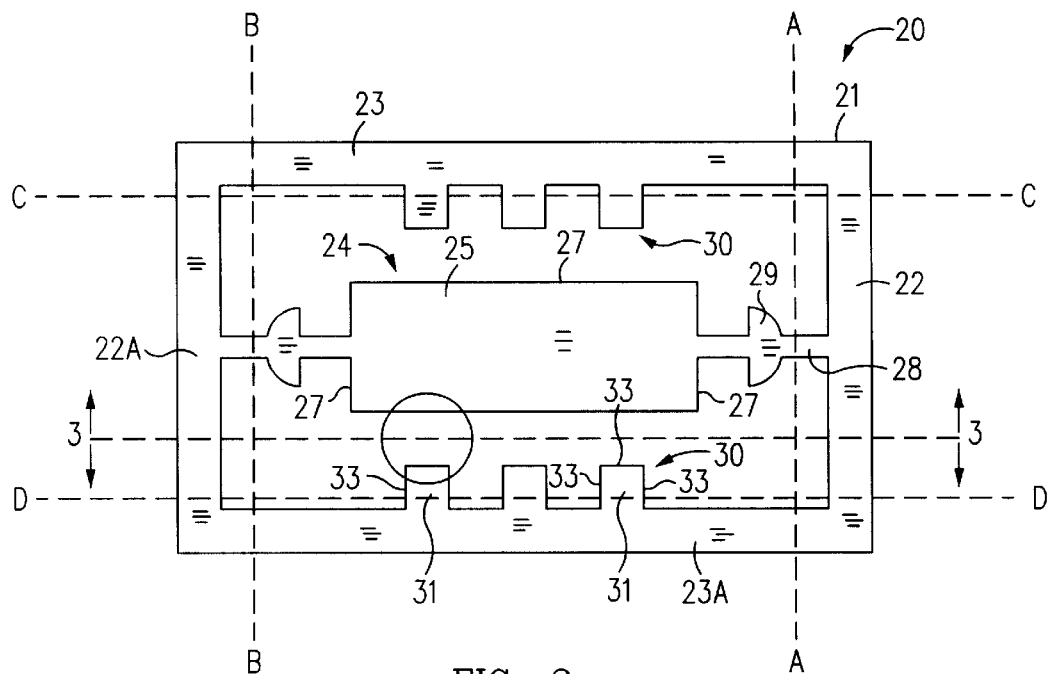
FIG. 2 is a top view of leadframe used for making a package.

Step 1 of FIG. 1 provides a metal leadframe. FIG. 2 is a top view of a first embodiment of a metal leadframe 20 in accordance with the present invention. For ease of view, shading is used in FIG. 2 to distinguish the metal portions of leadframe 20 from empty spaces between the various elements of leadframe 20.

Leadframe 20 of FIG. 2 is planar or substantially planar and is made of a conventional leadframe metal, such as copper or copper alloys, plated copper or plated copper alloys, Alloy 42 (42% nickel, 58% iron), or copper plated steel, depending on the application. The opposing upper and lower surfaces of leadframe 20 may be plated with different metals. For example, the tabs 30 and/ or other portions of leadframe 20 which ultimately are enclosed within the package may be plated with silver, gold, nickel palladium, or copper. Such plating, for example, may enhance attachment of bond wires to tabs 30.

FIG. 2 includes dash lines A—A, B—B, C—C, and D—D. These are lines which indicate where leadframe 20 is cut in Step 6 of FIG. 1. Step 6 is described below. FIG. 2 also includes a circle and dashed line 3—3, which indicate the view of FIG. 3.

Leadframe 20 of FIG. 2 includes a peripheral rectangular frame 21. Frame 21 consists of four rectilinear members. The two intersecting pairs of parallel members of frame 21 are denoted as members 22 and 22A and 23 and 23A. Artisans should understand that the terms "rectangular" or "rectangle" as used herein include a square, which is a rectangle with four equivalent sides.

A rectangular die pad 24 is within and connected to frame 21. Die pad 24 has a planar or substantially planar upper first surface 25 and, although it is not shown in FIG. 2, an opposite planar or substantially planar lower second surface 26. Die pad 24 also has peripheral side surfaces 27 between upper first surface 25 and lower second surface 26.

A connector 28 connects two parallel side surfaces 27 of die pad 24 to members 22 and 22A of frame 21 of FIG. 2. Each connector 28 includes a mushroom-shaped anchor 29, although other shapes may be used for anchor 29.

Three finger-like rectangular tabs 30 are connected to and extend from members 23 and 23A toward an adjacent side surface 27 of die pad 24 without contacting side surfaces 27. As a result of this configuration, the completed package will have a single row of three contacts on two parallel sides of the package. Tabs 30 ultimately are severed from members 23 and 23A along cut lines C—C and D—D of FIG. 2, and become the contacts of the package.

The number, location, and shape of tabs 30 may vary. For example, instead of having tabs 30 only on members 23 and 23A of frame 21 of leadframe 20, as in FIG. 2, sets of tabs 30 may be placed on all four members of frame 21. This alternative embodiment would result in the formation of a quad package.

Each tab 30 of FIG. 2 has a planar or substantially planar upper first surface 31 and, although it is not shown in FIG. 2, an opposite planar or substantially planar lower second surface 32. Each tab 30 also has three peripheral side surfaces 33 between upper first surface 31 and lower second surface 32.

FIGS. 3–6 show an enlarged cross-sectional side view of the circled portion of FIG. 2 along line 3—3. In particular, FIGS. 3–6 show, in accordance with the present invention, a side surface 27 of a die pad 24 and a side surface 33 of a tab 30 of leadframe 20 of FIG. 2.

Figure 3:
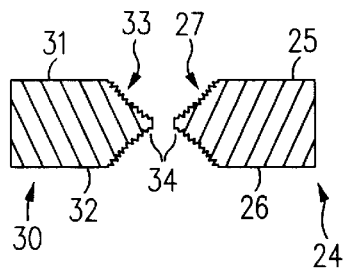
FIG. 3 is an enlarged cross-sectional side view of a circled portion of FIG. 2.

Side surface 27 of die pad 24 and side surface 33 of tab 30 of FIG. 3 have reentrant portions. In particular, the upper and lower portions of side surfaces 27 and 33 are reentrant such that there is a central peak 34 which extends outward from side surfaces 27 and 33 of die pad 24 and tab 30, respectively. Encapsulant material flows into the reentrant portions of side surfaces 27 and 33. Central peak 34 extends into the encapsulant material.

The reentrant portions of side surfaces 27 of die pad 24 and side surfaces 33 of tabs 30 of FIG. 3 have the function, in a completed package, of enhancing the connection between the encapsulating material, on the one hand, and die pad 24 and the contacts of the package (i.e., severed tabs 30), on the other hand.

In addition to having reentrant portions, side surface 27 of die pad 24 and side surface 33 of tab 30 of FIG. 3 have a roughly-textured surface which includes numerous asperities. Encapsulant material flows into the areas of the asperities. The asperities also enhance the connection between the encapsulant material and die pad 24 and the contacts of the package (i.e., the severed tabs 30).

Figure 4:
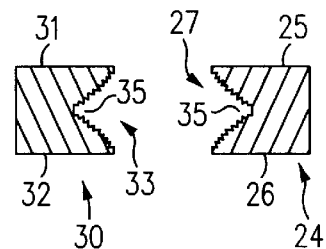
FIG. 4 is a first alternative embodiment of a side surface of a die pad and tab.

FIG. 4 shows a first alternative profile for side surfaces 27 of die pad 24 and side surfaces 33 of tabs 30 of leadframe 20 of FIG. 2. In the embodiment of FIG. 4, side surfaces 27 and 33 each have a central depression 35 and a roughly-textured surface which includes numerous asperities. Encapsulant material flows into central depression 35 and in the areas of the asperities. The reentrant portion and asperities of side surfaces 27 and 33 of FIG. 4 have the function, in a completed package, of enhancing the connection between the encapsulant material and die pad 24 and the contacts of the package (i.e., the severed tabs 30).

Figure 5:
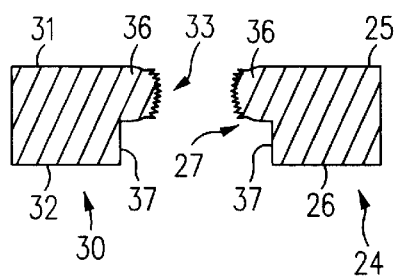
FIG. 5 is a second alternative embodiment of a side surface of a die pad and tab.

FIG. 5 shows a second alternative profile for side surfaces 27 of die pad 24 and side surfaces 33 of tabs 30 of leadframe 20 of FIG. 2. In the embodiment of FIG. 5, side surfaces 27 and 33 include a rounded lip 36 adjacent to upper surface 25 and 31 of die pad 24 and tab 30, respectively. Lip 30 has a roughly-textured surface which includes numerous asperities. Side surfaces 27 and 33 also have a reentrant orthogonal portion 37 beneath lip 3G, adjacent to lower second surface 29 and 32 of die pad 24 and tab 30, respectively. Encapsulant material flows beneath lip 36 and into the area of the asperities. Like the embodiments of FIGS. 3 and 4, the reentrant portions and asperities of side surface 27 of die pad 24 and side surface 33 of tab 30 of FIG. 5 have the function, in a completed package, of enhancing the connection between the encapsulant material and die pad 24 and the contacts of the package (i.e., tabs 30 after they are severed from members 23 and 23A).

Figure 6:
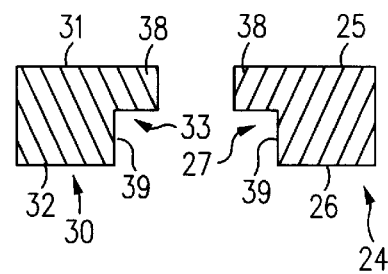
FIG. 6 is a third alternative embodiment of a side surface of a die pad and tab.

FIG. 6 shows a third alternative for side surfaces 27 of die pad 24 and side surfaces 33 of tabs 30 of leadframe 20 of FIG. 1. In this embodiment, side surfaces 27 and 33 each include a rectangular lip 38 adjacent to upper surface 25 and 31 of die pad 24 and tab 30, respectively. Side surfaces 27 and 33 also have a reentrant orthogonal portion 39 beneath lip 38 adjacent to lower second surface 29 and 32 of die pad 24 and tab 30, respectively. Encapsulant material flows beneath lip 38. Like the embodiments of FIGS. 3–5, the reentrant portions of side surface 27 of die pad 24 and side surface 33 of tab 30 of FIG. 6 have the function, in a completed package, of enhancing the connection between the encapsulant material and die pad 24 and the contacts of the package (i.e., severed tabs 30).

As discussed above, Step 1 of FIG. 1 provides a metal leadframe having features like those shown in FIG. 2 and either FIG. 3, 4, 5, or 6, or equivalents thereof. Leadframe 20 of FIG. 2 is formed from rolled strip metal stock by wet chemical etching or mechanical stamping using progressive dies.

As is well known, chemical etching (also known as chemical milling) is a process that uses photolithography and metal-dissolving chemicals to etch a pattern into a metal strip. The photoresist is exposed to ultraviolet light through a photo mask having a desired pattern, and is subsequently developed and cured. Chemicals are sprayed or otherwise applied to the masked strip, and exposed portions of the strip are etched away, leaving the desired pattern.

As is also well known, progressive stamping uses sets of progressive dies to mechanically remove metal from a metal strip. Each of a plurality of stamping stations uses one of the dies to punch a distinct small area of metal from the strip as the strip moves through the stations.

A leadframe 20 having side surfaces like FIG. 3 can be formed by chemically etching the rolled strip metal stock from both sides using a conventional liquid etchant. The etch process is stopped early so that there is an underetching of all of the side surfaces of the components of leadframe 20, including side surfaces 27 of die pad 24 and side surfaces 33 of tabs 30, compared to the time it would take to form vertical side surfaces. The size and shape of central peak 34 of FIG. 2 is controlled by the amount of underetching.

A leadframe 20 having side surfaces like FIG. 4 can be formed by chemically etching the rolled strip metal stock from one side using a conventional liquid etchant. The etch process is continued beyond the time required to form orthogonal side surfaces for the components of leadframe 20. The size and shape of central depression 35 of FIG. 3 is controlled by the amount of overetching.

A leadframe 20 having side surfaces like FIG. 5 can be formed in a two step process. The first step of such a process involves forming a leadframe 20 by chemical etching or progressive stamping so that the side surfaces of the components of leadframe 20, including die pad 24 and tabs 30, have an orthogonal profile The second step involves coining the upper first surface of the leadframe 20, that is, applying a high pressure impact to the upper first surface of the leadframe 20. This step deforms the side surfaces of leadframe 40 adjacent to the impacted surface so that the rounded, asperity-marked protruding lip 36 of FIG. 5 is formed.

A leadframe 20 having side surfaces like FIG. 6 can be formed by progressive stamping. The side surfaces of the components of leadframe 20, including side surfaces 27 of die pad 24 and the side surfaces 33 of tabs 30, can be provided with a rectangular lip 38 and a reentrant orthogonal portion 39 by including intermediate stamping steps which do not fully cut through the rolled strip metal stock before finally cutting through the rolled strip sheet. The intermediate stamping steps and the final cutting steps combine to form the rectangular, protruding lips 38 of side surfaces 27 and 33 of FIG. 5.

Step 2 of FIG. 1 places an integrated circuit die onto upper first surface 25 of die pad 24. The placement and attachment of the die onto die pad 24 may be performed using a conventional die attach machine and conventional die attach adhesives. During Step 2 and the subsequent assembly steps, leadframe 20 of FIG. 2 is grounded to protect against electrostatic discharge ("ESD").

Step 3 of FIG. 1 electrically connects a conductive metal bond wire between individual bonding pads on the integrated circuit die and the upper first surface 31 of individual tabs 30 on leadframe 20 of FIG. 2. Tabs 30 ultimately become contacts in the completed package, after tabs 30 are severed from members 23 and 23A of frame 21. Conventional bond wire attachment equipment may be used for Step 3. Leadframe 20 of FIG. 2 is grounded during this wiring step to prevent damage to the integrated circuit dies due to electrostatic discharge. At the completion of Step 3, each bonding pad of each die is electrically connected to a tab 30 of leadframe 20 of FIG. 1, which is grounded. Tabs 30 of leadframe 20 are all shorted together, which facilitates ESD protection.

In Step 4 of FIG. 1, the lower second surface of leadframe 20 of FIG. 2 is placed on a flat surface, and a viscous adhesive encapsulating material is applied onto the upward facing upper first surface of leadframe 20. The encapsulating material is applied so that the encapsulating material covers: the integrated circuit die; the bond wires; any exposed peripheral portions of upper first surface 25 of die pad 24 around the die; side surfaces 27 of die pad 24; upper first surface 31 of tabs 30; side surfaces 33 of tabs 33; and part or all of the width of members 22, 22A, 23, and 23A of frame 21. The encapsulant material also fills the empty spaces between the components within frame 21 of leadframe 20. The encapsulant material does not, however, cover lower second surface 26 of die pad 24 or lower second surfaces 32 of tabs 30 of FIG. 2. In an alternative embodiment, die pad 24 may be up set during the encapsulation step so that a thin layer of encapsulant material forms under lower second surface 26 of die pad 24. If such a step were used, die pad 24 would be completely internal to the package. Finally, the encapsulant material is hardened.

There are several methods by which Step 4 of FIG. 1 may be accomplished, depending on the application. For example, as a first step, leadframe 20 of FIG. 2 is placed on a horizontal surface. As a second step, a contiguous bead of a conventional hardenable viscous adhesive material, such as HYSOL 4451 epoxy from the Dexter-Hysol Company of City of Industry, Calif., is applied onto the upper first surface of side members 22, 22A, 23, and 23A of frame 21 of leadframe 20 of FIG. 2, forming a closed rectangular dam. As a third step, the dam is solidified, such as by heating at 150° C. for one hour. As a fourth step, a conventional hardenable viscous adhesive material suitable for encapsulating packages, such as HYSOL 4450 encapsulant, is applied within the dam so that the incomplete package within the dam is covered with encapsulant material. As a final step, the encapsulant material is hardened, such as by heating at 150° C. for one hour, forming a single solid block of encapsulant material above and on leadframe 20, including on its side surfaces.

Alternatively, Step 4 of FIG. 1 may be accomplished using conventional plastic molding techniques. In such a method, leadframe 20 of FIG. 2 is placed in a mold, and a single block of solid molded encapsulant material is formed above and on leadframe 20, including on its side surfaces. The encapsulant material may be a conventional plastic molding compound applied using conventional techniques. Example molding compounds include NITTO MP-8000AN molding compound from the Nitto Company of Japan, and EME 7351 UT molding compound from the Sumitomo Company of Japan. Conventional gates may be formed in leadframe 20 to assist in the molding process.

In Step 5 of FIG. 1, the portions of leadframe 20 of FIG. 2 which are not covered with the encapsulant material, including lower second surface 26 of die pad 24 and lower second surfaces 32 of tabs 30, are plated using a conventional plating metal compatible with printed circuit boards. For example, exposed second surfaces 26 and 33 of die pad 24 and tabs 30, respectively, may be plated with gold, nickel palladium, inconel, lead tin solder, or tantalum, depending on the application. The plating step is facilitated by the electrical interconnection of the components of leadframe 20.

Figure 7:
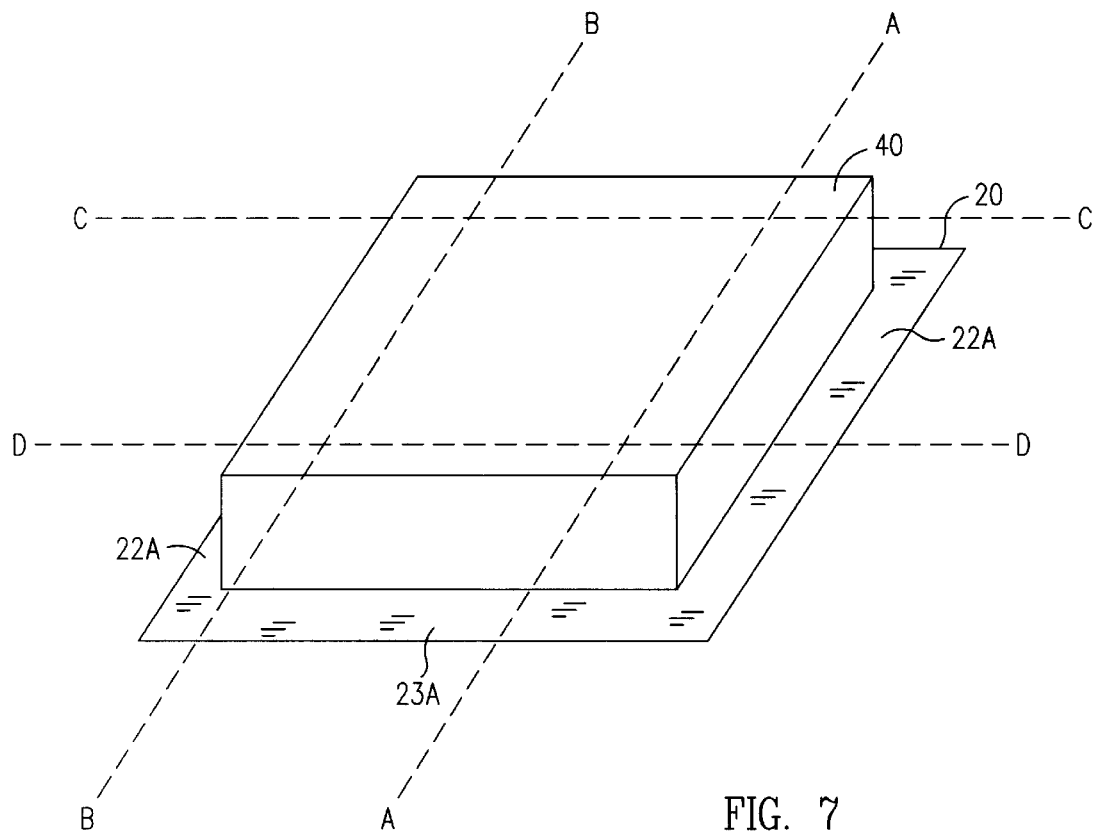
FIG. 7 is a top view of the leadframe of FIG. 1 after encapsulation. The dashed lines are cutting paths for a subsequent sawing step.

FIG. 7 is a top view of leadframe 20 of FIG. 2 after the completion of Steps 1–5 of FIG. 1. A rectangular block of hardened encapsulant material 40 covers the upper first surface of leadframe 20. Although not shown, encapsulant material 40 also covers side surfaces 27 and 33 of die pad 24 and tabs 30, respectively, of leadframe 20. The block of encapsulant material 40 in FIG. 7 covers a portion of the width of members 22, 22A, 23, and 23A of frame 21 of leadframe 20. The peripheral portions of members 22, 22A, 23, and 23A of frame 21 remain exposed. Alternatively, encapsulant material 40 could be deposited over the entire upper first surface of leadframe 20. As a second alternative, encapsulant material 40 could be deposited within frame 21 so that tabs 30 are covered, but members 22, 22A, 23, and 23A are not covered.

Step 6 of FIG. 1 cuts leadframe 20 of FIG. 7 in situ. Referring to FIGS. 2 and 7, Step 6 severs the connection between tabs 30 and members 23 and 23A of frame 21 of leadframe 20. Step 2 also severs connectors 28 between die pad 24 and members 22 and 22A of frame 21 of leadframe 20. Step 6 also cuts encapsulant material 40, forming vertical external side surfaces of the package. Finally, Step 6 completes the formation of the package by cutting a completed package away from the disposable portions of leadframe 20.

Step 6 may be performed using a saw or other shearing apparatus. To perform Step 6 using a saw, the encapsulated leadframe 20 of FIG. 7 is inverted and placed on sticky film. Using the exposed portions of leadframe 20 as a guide (see FIG. 2), a conventional wafer saw is used to saw a completed package from the encapsulated leadframe 20. Crisscrossing rectilinear cuts are made along dashed lines A—A, B—B, C—C, and D—D of FIGS. 2 and 7 so that the disposable portions of leadframe 20, including side members 22, 22A, 23, and 23A of frame 21, connectors 28 and anchors 29, are cut away from the package, isolated within encapsulant material 40, or obliterated by the saw. The cutting path of the saw and/or the width of the saw blade should be selected so that the connections between tabs 30 and members 23 and 23A are severed and side members 22, 22A, 23, and 23A are cut away or obliterated, but all or most of each tab 30 remains intact.

FIG. 8 is a cross-sectional side view of an exemplary package 50 made from leadframe 20 of FIG. 2 according to Steps 1–6 of FIG. 1. Package 50 has a planar or substantially planar external upper first surface 51, and an opposite planar or substantially planar external lower second surface 52. Orthogonal external package sides 57 are at the periphery of package 50 between upper first surface 51 and lower second surface 52. Sides 57 were formed during Step 6, when encapsulant material 40 and tabs 30 were cut.

Lower second surface 52 of package 50 of FIG. 8 consists of die pad 24, a plurality of peripheral contacts 53, and hardened encapsulant material 40. Die pad 24 and each contact 53 are like islands at the lower external second surface 52 of package 50. They are physically separated from each other by encapsulant material 40.

Die pad 24 and contacts 53 of FIG. 8 are vestiges of leadframe 20 of FIG. 2. Referring to FIGS. 2 and 8, contacts 53 of package 50 of FIG. 8 were formed when the connections between tabs 30 and members 23 and 23A were severed by the saw during Step 6.

Die pad 24 of FIG. 8 is rectangular and is located at lower second surface 52 of package 50. Die pad 24 includes a planar or substantially planar upper first surface 25, an opposite planar or substantially planar second surface 26, and peripheral side surfaces 27. Second surface 26 of die pad 24 is in the same plane as lower second surface 52 of package 50 in FIG. 8, although in alternative embodiments, die pad 24 may be set up into encapsulant material 40.

Although not fully shown in FIG. 8, rectangular die pad 24 has four side surfaces 27 (only two are shown). Each side surface 27 of die pad 24 has a reentrant portion(s), as exemplified by FIGS. 3–6. In addition, side surface 27 may have asperities, as exemplified by FIGS. 3–5.

In FIG. 8, integrated circuit die 56 is on and attached to upper first surface 25 of die pad 24. Peripheral portions of upper first surface 25 are covered by encapsulant material 40. Side surfaces 27 of die pad 24 also are covered by encapsulant material 40. Lower second surface 26 of die pad 24 is not covered by encapsulant material 40, but rather is exposed at lower external surface 52 of package 50. In an alternative embodiment (not shown), die pad 24 may be entirely internal to encapsulant material 40 of package 50.

Two contacts 53 are shown in package 50 of FIG. 8, but since package 50 was constructed from leadframe 20 of FIG. 2, it should be understood that package 50 has a set of three contacts 53 on two sides 57 of package 50. In alternative embodiments, package 50 could be formed with a different number or arrangement of contacts, depending on the application.

Each contact 53 of FIG. 8 has a substantially rectangular perimeter and is located at the lower second surface 52 of package 50. Each contact 53 includes a planar or substantially planar upper first surface 31, an opposite planar or substantially planar second surface 32, three internal side surfaces 33 (only one is shown in FIG. 8) having reentrant portions, and one external orthogonal side surface 55. Second surface 32 of contact 53 is in the same plane as lower second surface 52 of package 50.

First surface 31 and side surfaces 33 of contacts 53 are covered with an encapsulant material. Second surface 32 and external side surface 55 of contacts 53 are not covered with encapsulant material.

Orthogonal external side surfaces 55 of contacts 53 of FIG. 8 were formed during Step 6 of FIG. 1 when the saw cut the connections between tabs 30 and members 23 and 23A of leadframe 20 of FIG. 2. Accordingly, the external side surface 55 of each contact 53 has a vertical profile which is the same plane as the corresponding vertical side 57 of package 50.

Although not shown in FIG. 8, the three internal side surfaces 33 (only one is shown) of each contact 53 have reentrant portions, as exemplified by FIGS. 3–6. In addition side surfaces 33 may have asperities, as exemplified by FIGS. 3–5. Both the reentrant portion(s) and asperities of contacts 53 enhance the connection between contacts 53 and encapsulant material 40 of package 50 of FIG. 8.

The perimeter of contacts 53 need not be substantially rectangular in shape. For example, if tabs 30 of leadframe 20 of FIG. 2 had a circular perimeter, then contacts 53 would have a largely circular perimeter with a rectilinear portion formed during the cutting of tab 30 from leadframe 20 in Step 6.

A bond wire 58 is connected between each bonding pad 56a of die 56 and the upper first surface 31 of each contact 53. Bond wire 58 electrically connects individual bonding pads 56a of die 56 to individual contacts 53.

Figure 9:
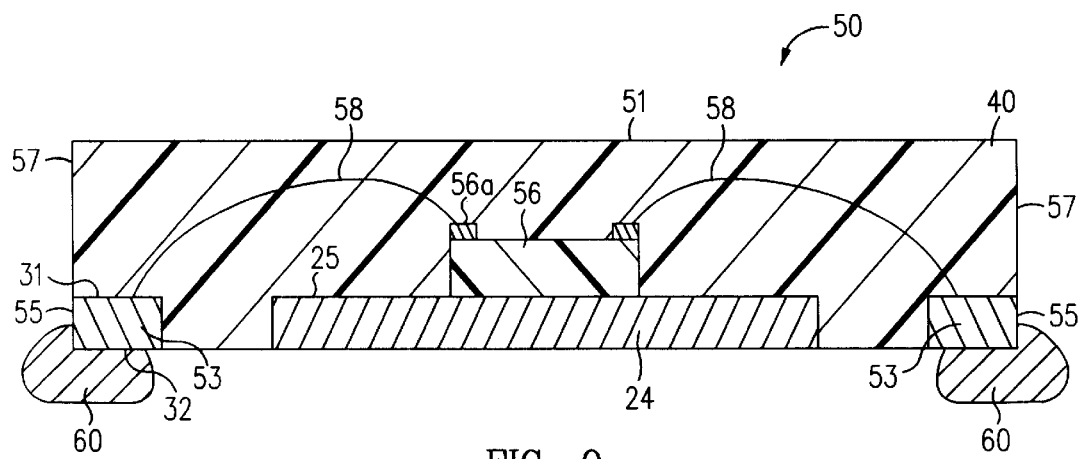
FIG. 9 is a cross-sectional side view of the package of FIG. 8 further including solder interconnection bumps on the package contacts.

Second surface 32 of contacts 53 of FIG. 8 may be directly connected to an external printed circuit board, as in an LCC package. Alternatively, a solder interconnection bump may be formed on contacts 53 for physically and electrically connecting package 50 to a printed circuit board. FIG. 9 shows a solder interconnection bump 60 formed on lower second surface 32 and external side surface 55 of each contact 53 of package 50 of FIG. 8.

In an alternative embodiment, second surface 26 of die pad 24 also may be connected, such as by solder paste, to the printed circuit board to facilitate package cooling. The cooling occurs by thermal conduction.

Figure 10:
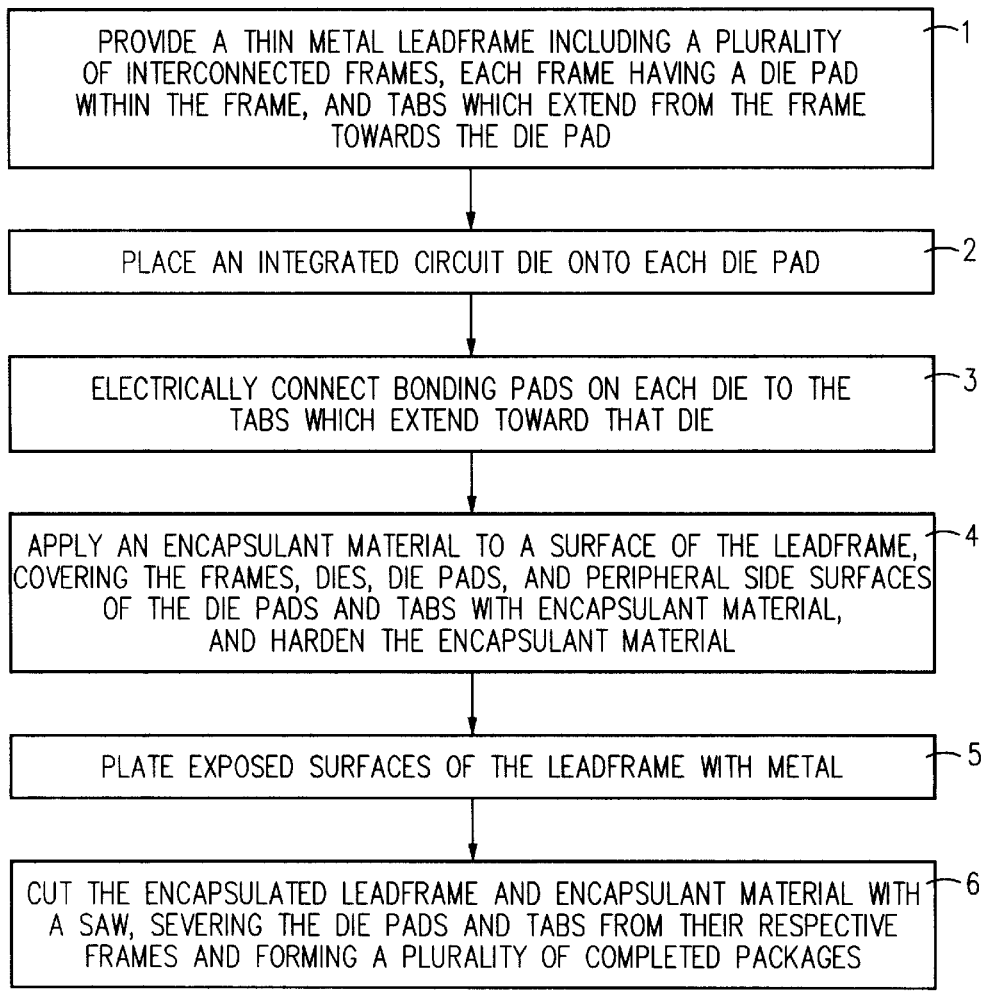
FIG. 10 is a flow chart of a method for making a plurality of packages simultaneously.

FIG. 10 is a flow chart for an alternative assembly method, in accordance with the present invention, for constructing a package like that of FIG. 8. In the method of FIG. 10, a plurality of packages are constructed simultaneously. The basic steps of the FIG. 10 process are the same as the FIG. 1 process.

Step 1 of FIG. 10 provides a thin metal leadframe which includes a plurality of interconnected rectangular frames in a matrix. A die pad is provided within each frame.

Figure 11:
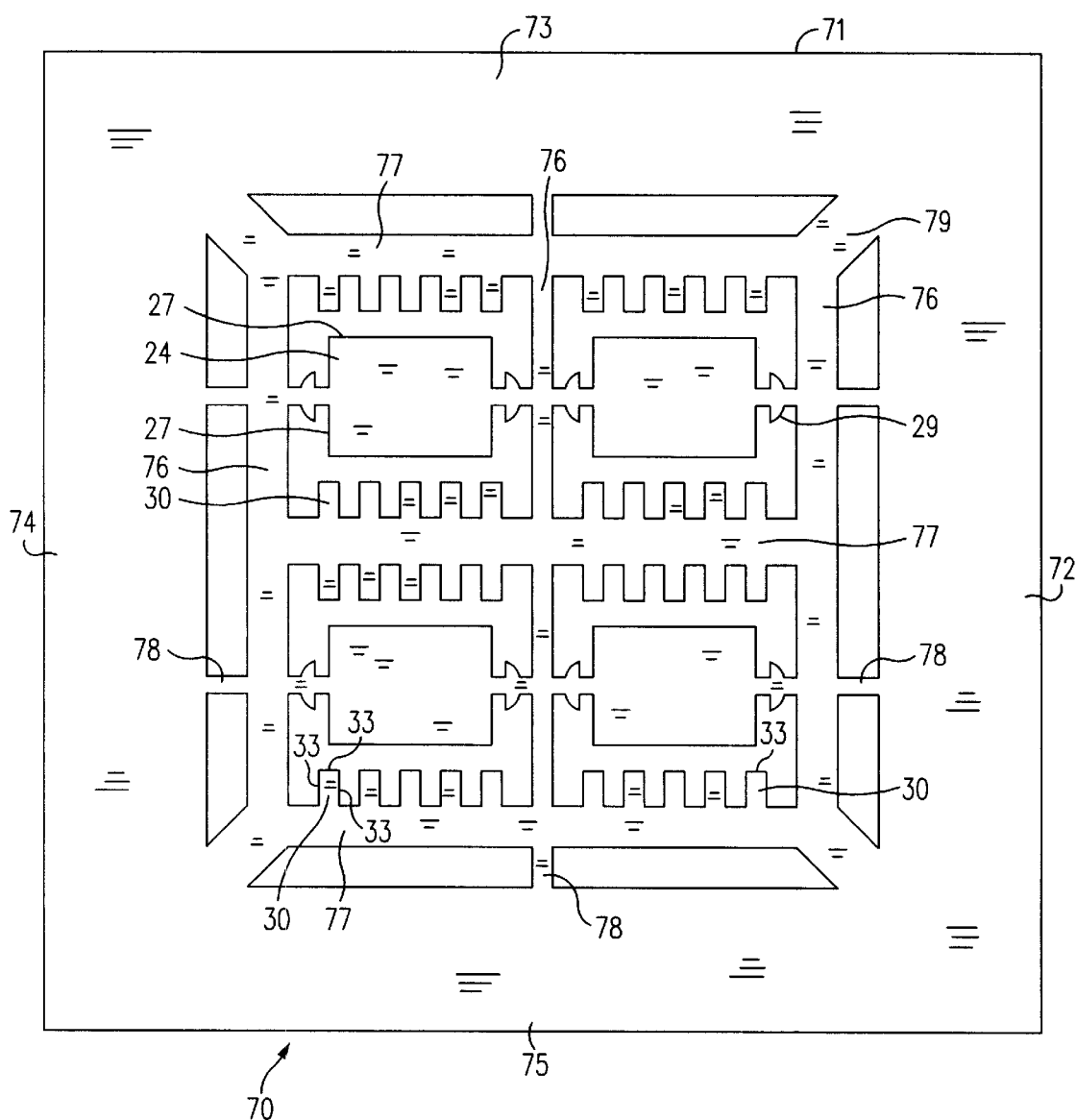
FIG. 11 is a top view of a leadframe used for making a plurality of packages simultaneously.

FIG. 11 shows an exemplary metal leadframe 70, in accordance with the present invention, suitable for Step 1 of FIG. 10. Shading is used in FIG. 11 to distinguish metal portions of leadframe 70 from empty space between the components of leadframe 70.

Leadframe 70 of FIG. 11 is planar or substantially planar and is formed of metal. The metals and methods used for constructing leadframe 70 are the same as those described above for leadframe 20 of FIG. 2.

Leadframe 70 of FIG. 11 includes a disposable rectangular outer frame 71. Outer frame 71 consists of four intersecting members, denoted as members 72–75. Member 72 is parallel to member 74, and member 73 is parallel to member 75.

Within outer frame 71 of FIG. 11 are four interconnected rectangular frames in a two by two matrix. These frames are formed by the intersection of three disposable strips 76 and three disposable strips 77. Each of the four interconnected frames of FIG. 11 has the same basic features as frame 21 of FIG. 2. Accordingly, the same reference numbers will be used, where applicable, and associated discussion will be abbreviated.

A rectangular die pad 24 is within and connected to each of the four frames formed by strips 76 and 77 of FIG. 11. As in FIG. 2, each die pad 24 of FIG. 11 has four side surfaces 27. Each side surface 27 has a reentrant portion(s), such as in the examples of FIGS. 3–6. Side surfaces 27 also may include asperities, such as those shown in FIGS. 3–5.

Three parallel strips 76 are within and connected to frame 71 of FIG. 11. A first strip 76 is adjacent to, parallel to, and connected to member 72 of frame 71. A second strip 76 is adjacent to, parallel to, and connected to member 74 of frame 71. A third strip 76 is located in the center of frame 71 between juxtaposed pairs of die pads 24. Each strip 76 of FIG. 11 is connected to each of the die pads 24 which are adjacent to that particular strip 76. A disposable mushroom-shaped anchor 29 connects each strip 76 to each adjacent die pad 24. Two disposable connectors 78 connect member 72 to its adjacent strip 76, and two connectors 78 connect member 74 to its adjacent strip 76. The number and locations of connectors 76 may vary.

Three parallel strips 77 also are within and connected to frame 71 of FIG. 11. One strip 77 is adjacent to, parallel to, and connected to side members 73 and 75 of frame 71. A disposable connector 78 connects members 73 and 75 to their respective adjacent strip 77. A third strip 77 is located in the center of frame 71 between juxtaposed pairs of die pads 24.

The intersecting ends of the peripheral strips 76 and 77 of FIG. 11 are connected to the inner corners of outer frame 71. A gate 79 extends at approximately a 45 degree angle from each of the four inner corners of frame 71 and connects to the interconnected ends of peripheral strips 76 and 77. Gate 79 is useful for the introduction of molding compound into a mold, where molding is the chosen method of encapsulation.

Central strip 76 of FIG. 11 intersects central strip 77 at the center of leadframe 70. The ends of central strips 76 and 77 intersect the peripheral strips 77 and 76, respectively.

In FIG. 11, a plurality of straight, evenly-spaced, finger-like, rectangular tabs 30 extend in sets of five from each strip 77 toward the sides of each of the die pads 24 adjacent that particular strip 77. Tabs 30 do not contact die pads 24. The central strip 77 that is between juxtaposed pairs of die pads 24 has mirror-image sets of five tabs 30 which extend in opposite directions toward each of the juxtaposed die pads 24. Each tab 30 will ultimately form a contact 53 of package 50 of FIG. 8.

Each tab 30 of FIG. 11 has three side surfaces 33 which have a reentrant portion(s), such as shown in FIGS. 3–6. Side surfaces 33 of tabs 53 also may include asperities, such as those shown in FIGS. 3–5. The reentrant portions and asperities of side surfaces 33 of tabs 30 enhance the connection between encapsulant material 40 and contacts 53 (i.e., severed tabs 30) of a completed package 10 of FIG. 8.

Step 2 of FIG. 10 places and attaches an integrated circuit die 56 on upper first surface 25 of each die pad 24 of leadframe 70 of FIG. 11, as described above for Step 2 of FIG. 1.

Referring to FIGS. 8 and 11, Step 3 of FIG. 10 electrically connects a conductive metal bond wire 58 between each bonding pad 56a on each integrated circuit die 56 attached to leadframe 70 and a tab 30. Bond wire 58 is connected to the first surface 31 of each tab 30. The methods for Step 3 of FIG. 11 are the same as described above for Step 3 of FIG. 1.

Step 4 of FIG. 10 covers each incomplete package of leadframe 70 of FIG. 11, including all of the dies 56, with a conventional viscous, adhesive encapsulant material. The methods and materials used for Step 4 of FIG. 10 are the same as for Step 4 of FIG. 1, except that the encapsulant material is applied onto all of the incomplete packages 50 of leadframe 70 of FIG. 11. The encapsulant material covers the upper first surface of leadframe 70, as well as side surfaces 27 and 33 of die pads 24 and tabs 33, respectively. The encapsulant material is then hardened into a single block which covers all of the incomplete packages of leadframe 70 of FIG. 11, as well as all or part of the width of members 72–75 of frame 71 of leadframe 70. Again, the lower second surface of leadframe 70, including lower surfaces 26 and 32 of die pads 24 and tabs 30, respectively, is not covered by encapsulant material, but instead remains exposed.

Step 5 of FIG. 10 plates the exposed lower surface of leadframe 70 of FIG. 11, including lower second surfaces 26 and 32 of die pads 24 and tabs 30, respectively, with a conventional plating metal. This step is accomplished as described above for Step 5 of FIG. 1.

Step 6 of FIG. 10 cuts leadframe 70 of FIG. 11 after the encapsulation step. Encapsulated leadframe 70 is cut in situ, similar to leadframe 20 of FIG. 7. The disposable portions of leadframe 70 are either severed from the packages, obliterated, or isolated by encapsulant material from the other components of package 50 of FIG. 8. The requirements of and methods used for Step 6 of FIG. 10 are basically the same as described above for Step 6 of FIG. 1, except that more cuts have to be made because leadframe 70 of FIG. 11 is bigger and has more components than leadframe 20 of FIG. 2.

Step 6 of FIG. 10 severs the connection between tabs 30 and strips 77 of leadframe 70. This cut forms the isolated, individual contacts 53 shown in package 50 of FIG. 8. Step 6 also severs the connection between anchors 29 and strips 76. This cut physically isolates die pads 24 within the encapsulant material. Step 6 also cuts through the single block of encapsulant material formed during Step 4 to form four packages 50 from leadframe 70 of FIG. 11.

Step 6 may be performed using a saw or other cutting apparatus. Where a saw is used for Step 6, the saw is moved along strips 76 and 77 (See FIG. 11). The saw blade used should be wider than strips 76 and 77 of FIG. 11, but narrower than the combined width of central strip 77 and the back-to-back tabs 30. As a result, moving the saw blade along strips 76 and 77 will obliterate strips 76 and 77, but will not obliterate tabs 30. As discussed above, the surface area of tabs 30 must be maintained because the severed tabs 30 become contacts 53 in package 50 of FIG. 8.

An exemplary method of accomplishing Step 6 of FIG. 10 includes a first step of inverting the encapsulated leadframe 70 and placing it on sticky paper. Using the exposed portions of leadframe 70 of FIG. 11 as a pattern, three parallel cuts are made, each of which goes through side members 73 and 75 and along and through the length of a strip 76 of leadframe 70. These three cuts form two of the four external side surfaces 57 of package 50 of FIG. 8; obliterate strips 76; and sever the connections between die pads 24 and strips 76.

Next, the encapsulated leadframe 70 is rotated 90 degrees, and three parallel cuts are made perpendicular to the original three cuts. Each of these latter three cuts goes through side members 72 and 74 and along and through the length of a strip 77. These latter three cuts also form the remaining two external side surfaces 57 of package 50 of FIG. 8. Since the width of the saw blade is selected to be wider than strips 76 and 77, but narrower than the combination of central strip 77 and tabs 30, the latter three cuts obliterate strips 77 but do not obliterate the tabs 30 which are attached to strips 77.

The six cuts described above complete the formation of the four packages 50 from leadframe 70 of FIG. 11 by separating the completed packages from one another and from the disposable portions of leadframe 70.

Artisans will appreciate that numerous variations of the packages, leadframes, and assembly methods described above are possible. As one example, changes can be made to leadframe 70 of FIG. 11 in order to change the size, shape and numbers of the packages 50 (FIG. 7) formed from leadframe 70. For example, instead of simultaneously forming four packages using a leadframe like leadframe 70 of FIG. 11, the size of the leadframe may be adjusted so that two, eight, sixteen, forty-eight or some other number of packages are formed simultaneously. As another example, one may multiply the number of packages formed simultaneously by forming several leadframes 70 adjacent to each other on a single strip of rolled stock, and processing all of the leadframes 70 on the strip simultaneously. As another example, the peripheral shapes of die pads 24 and tabs 30 may be changed from rectangular to some other shape.

In addition, the profiles of side surfaces 27 and 33 of die pads 24 and tabs 30, respectively, can be altered from the embodiments of FIGS. 3–6, provided that the function of enhancing the connection between encapsulant material 40 and the die pads 24 and contacts 53 of packages 50 of FIG. 8 is maintained.

Leadframe 70 of FIG. 11 may be modified in other ways as well. For example, the peripheral strips 76 and 77 that are adjacent to members 72–75, may be omitted. In such a case, the anchors 29 of FIG. 11 would be attached to members 72 and 74, and tabs 30 would be attached to members 73 and 75 of frame 71 of leadframe 70.

As a final example, instead of forming a single block of encapsulant material over all of the dies and incomplete packages of leadframe 70 of FIG. 11, a mold having individualized cavities for forming a block of encapsulant material above each the four interconnected frames and die pads 24 of leadframe 70 may be used. In such a case, less encapsulant material would be cut in Step 6 of FIG. 10.

The above description of embodiments of this invention is intended to be illustrative and not limiting. Other embodiments of this invention will be obvious to those skilled in the art in view of the above disclosure.

What is claimed:

1. A package for an integrated circuit die comprising:
   an integrated circuit die;
   a package body formed of an encapsulant material, the encapsulant material covering said die;
   a plurality of substantially rectangular metal contacts;
      wherein each contact has a planar first surface, a planar second surface that is opposite and coextensive with said first surface, a first end surface between the first and second surfaces, a second end surface between the first and second surfaces and opposite said first end surface, a first side surface between the first and second surfaces and between the first and surface end surfaces, and a second side surface that is between the first and second surfaces, between the first and second end surfaces, and opposite said first side surface, wherein an electrical conductor is connected between the die and the first surface of each contact, and the second surface of each contact is exposed in a common plane with a planar first exterior surface of the package body, and wherein the first end surface and the first and second side surfaces of each contact include a reentrant portion covered by the encapsulant material; and a substantially rectangular metal die pad having a planar first surface with the die mounted thereon, an planar second opposite the first surface, and side surfaces around the die pad between the first surface and the second surface;

wherein the side surfaces of the die pad include a reentrant portion covered by the encapsulant material.

2. The package of claim 1, wherein the second surface of the die pad is exposed in the plane of the first exterior surface of the package body.

3. The package of claim 1, wherein the second surface of the die pad is fully covered with the encapsulant material.

4. The package of claim 1, wherein the side surfaces of the die pad and the side surfaces and first end surface of the contacts include a central peak.

5. The package of claim 1, wherein the side surfaces of the die pad and the side surfaces and first end surface of the contacts include a central depression.

6. The package of claim 1 wherein the side surfaces of the die pad include a lip at the first surface of the die pad, and the side surfaces and first end surface of the contacts include a lip at the first surface of the contact.

7. The package of claim 1, wherein the side surfaces of the die pad and the side surfaces and first end surface of the contacts further include numerous asperities on said reentrant portion, said asperities covered with the encapsulant material.

8. The package of claim 1, wherein the package body includes orthogonal exterior side surfaces adjacent to the first exterior surface, and the second end surface of each contact is exposed in a common plane with one of the exterior side surfaces of the package body.

9. The package of claim 2, wherein the package body includes orthogonal exterior side surfaces adjacent to the first exterior surface, and the second end surface of each contact is exposed in a common plane with one of the exterior side surfaces of the package body.

10. A leadframe for making an integrated circuit die package comprising:

a rectangular metal frame;

a substantially rectangular metal die pad within and connected to an inside edge of the frame, wherein said die pad has a planar first surface, a planar second surface opposite and coextensive with the first surface, and side surfaces between said first and second surfaces; and plurality of substantially rectangular metal tabs, wherein each of said tabs is within and connected to an inside edge of said frame and includes a planar first surface, a planar second surface opposite and coextensive with the first surface, two opposing side surfaces between the first and second surfaces, and an end surface opposite the frame and facing the die pad, wherein the side surfaces of the die pad and the side surfaces and end surface of the tabs include a reentrant portion.

11. The leadframe of claim 10, wherein the side surfaces of the die pad and the side surfaces and end surface of the tabs include a central peak.

12. The leadframe of claim 10, wherein the side surfaces of the die pad and the side surfaces and end surface of the tabs include a central depression.

13. The leadframe of claim 10, wherein the side surfaces of the die pad include a lip at the first surface of the die pad, and the side surfaces and end surface of the tabs include a lip adjacent to the first surface of the tab.

14. The leadframe of claim 10, wherein the side surfaces of the die pad and the side surfaces and end surface of the tabs include numerous asperities on said reentrant portion.

15. A leadframe structure for making a plurality of encapsulated integrated circuit die packages comprising:

a plurality of interconnected rectangular metal frames in a matrix;

a substantially rectangular metal die pad within and connected to an inside edge of each of the frames, wherein said die pad has a planar first surface, a planar second surface opposite and coextensive with the first surface, and side surfaces between said first and second surfaces; and a plurality of substantially rectangular metal tabs within and connected to an inside edge of each frame, wherein each of said tabs includes a planar first surface, a planar second surface opposite and coextensive with the first surface, two opposing side surfaces between the first and second surfaces, and an end surface opposite the frame and facing the die pad, and wherein the side surfaces of the die pad and the side surfaces and end surface of the tabs include a reentrant portion.

16. The leadframe structure of claim 15, wherein the side surfaces of the die pads and tabs include a central peak.

17. The leadframe structure of claim 15, wherein the side surfaces of the die pads and tabs include a central depression.

18. The leadframe structure of claim 15, wherein the side surfaces of each die pad include a lip at the first surface of the die pad, and the side surfaces and end surface of the tabs include a lip adjacent to the first surface of the tab.

19. The leadframe structure of claim 15, wherein the side surfaces of the die pad and the side surfaces and end surface of the tabs further include numerous asperities on said reentrant portion.

* * * * *

UNITED STATES PATENT AND TRADEMARK OFFICE
CERTIFICATE OF CORRECTION

PATENT NO. : 6,143,981
DATED : November 7, 2000
INVENTOR(S) : Glenn, Thomas P.

It is certified that error appears in the above-identified patent and that said Letters Patent is hereby corrected as shown below:

Column 12,
Line 65, delete ";" and insert -- , --.

Column 13,
Line 19, delete "an" and insert -- a --.
Line 20, after "second" and before "opposite" insert -- surface --.
Line 22, delete ";" and insert -- , --.

Signed and Sealed this

Sixth Day of August, 2002

Attest:

JAMES E. ROGAN
Attesting Officer    Director of the United States Patent and Trademark Office